United States Patent
Choi et al.

(10) Patent No.: US 10,219,397 B2
(45) Date of Patent: Feb. 26, 2019

(54) ELECTRONIC DEVICE

(71) Applicant: Samsung Electronics Co., Ltd., Gyeonggi-do (KR)

(72) Inventors: Jin-Hyuk Choi, Gyeonggi-do (KR); Jae-Woo Lee, Seoul (KR); Jee-Young Jung, Seoul (KR); Jong-Chul Choi, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 282 days.

(21) Appl. No.: 15/095,362

(22) Filed: Apr. 11, 2016

(65) Prior Publication Data

US 2016/0301150 A1  Oct. 13, 2016

(30) Foreign Application Priority Data

Apr. 10, 2015 (KR) .................. 10-2015-0050816

(51) Int. Cl.
*H01R 12/77* (2011.01)
*H05K 5/03* (2006.01)
(Continued)

(52) U.S. Cl.
CPC ................ *H05K 5/03* (2013.01); *G06F 1/16* (2013.01); *G06F 1/1616* (2013.01); *G06F 1/1635* (2013.01); *G06F 1/1647* (2013.01); *G06F 1/1681* (2013.01); *G06F 1/1683* (2013.01); *H04M 1/0216* (2013.01);
(Continued)

(58) Field of Classification Search
CPC .. H05K 5/03; H05K 2201/057; H05K 1/0281; H05K 1/148; G06F 1/16; G06F 1/1681; G06F 1/1618; G06F 1/1616; G06F 1/1635; G06F 1/1647; G06F 1/1683;
(Continued)

(56) References Cited

U.S. PATENT DOCUMENTS 7,119,285 B2 * 10/2006 Kim .................. H05K 1/028
174/254
2010/0128001 A1 * 5/2010 Kimura .................. G06F 3/045
345/174
(Continued)

FOREIGN PATENT DOCUMENTS

JP      2005318247      11/2005
KR     1020140095206    8/2014
KR     1020140136771    12/2014

*Primary Examiner* — Jinhee Lee
*Assistant Examiner* — Ingrid Wright
(74) *Attorney, Agent, or Firm* — The Farrell Law Firm, P.C.

(57) ABSTRACT

An electronic device includes a first main body part at least one second main body part connected to the first main body part so as to be rotatable, or such that the first and second main body parts pivot relative to each other, and a connecting part that connects the second main body part to the first main body part or another second main body part adjacent thereto, wherein the connecting part includes a connecting member that rotatably connects the first and at least one second main body parts, a flexible printed circuit board (FPCB) that is surrounded by the connecting member and electrically connects at least one second main body part to the first main body part and a reinforcing member that is interposed between the connecting member and the FPCB and at least partially overlaps the FPCB.

19 Claims, 15 Drawing Sheets

(51) Int. Cl.
*H05K 1/02* (2006.01)
*G06F 1/16* (2006.01)
*H04M 1/02* (2006.01)
*H05K 1/14* (2006.01)

(52) U.S. Cl.
CPC .......... *H05K 1/0281* (2013.01); *H05K 1/148* (2013.01); *G06F 2200/1633* (2013.01); *H04M 1/0247* (2013.01); *H04M 2250/16* (2013.01); *H05K 2201/057* (2013.01)

(58) Field of Classification Search
CPC ........ G06F 2200/1633; H04M 1/0216; H04M 1/0247; H04M 2250/16; H01R 12/77
USPC ............ 361/679.55, 679.01, 679.02, 679.26, 361/679.27, 679.28, 679.29, 749; 455/575.1–575.4
See application file for complete search history.

(56) References Cited

U.S. PATENT DOCUMENTS

2012/0147535 A1    6/2012  Ahn et al.
2014/0076769 A1*   3/2014  McDonald .............. B65B 55/20
                                                            206/583

* cited by examiner

ELECTRONIC DEVICE

PRIORITY

This application claims priority under 35 U.S.C. § 119(a) to Korean Patent Application Serial No. 10-2015-0050816, which was filed in the Korean Intellectual Property Office on Apr. 10, 2015, the entire content of which is incorporated herein by reference.

BACKGROUND

1. Field of the Disclosure

The present disclosure generally relates to an electronic device and, more particularly, to an electronic device that includes one or more functional units (e.g., main body parts).

2. Description of the Related Art

With the development of information and communication industries, electronic devices function as important means for delivering various types of information to users. As the level of integration of electronic devices has been raised, and high-speed, high-capacity wireless communication has been widely used, electronic devices may provide various functions and programs embedded therein to users, or may provide various functions and programs to users while operating in conjunction with networks, such as Internet networks, etc.

Functions implemented by electronic devices or interworking between electronic devices and networks may provide users with easy access to various types of information. For example, multimedia functions are provided to users through images, sounds, etc., so that the multimedia functions may rapidly deliver a large amount of information to the users. In order to rapidly deliver a large amount of information to electronic devices, competition for improving the performance of electronic devices is intense.

SUMMARY

Various aspects of the present disclosure provide an electronic device having a plurality of functional units therein, which may perform a mechanical folding/unfolding operation of the functional units while making the external appearance of the electronic device appealing.

In addition, various aspects of the present disclosure provide an electronic device that may ensure the durability and reliability of an electrical connection structure, which electrically connects a plurality of functional units, even though a mechanical folding/unfolding operation of the electrical connection structure is repeated.

In accordance with various aspects of the present disclosure an electronic device includes a first main body part, at least one second main body part connected to the first main body part so as to be rotatable, or such that the first and second main body parts pivot relative to each other and a connecting part that connects at least one second main body part to the first main body part or another second main body part adjacent thereto, wherein the connecting part may include a connecting member that rotatably connects the first and second main body parts, a flexible printed circuit board (FPCB) that is surrounded by the connecting member and electrically connects at least one second main body part to the first main body part and a reinforcing member that is interposed between the connecting member and the FPCB and at least partially overlaps the FPCB.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
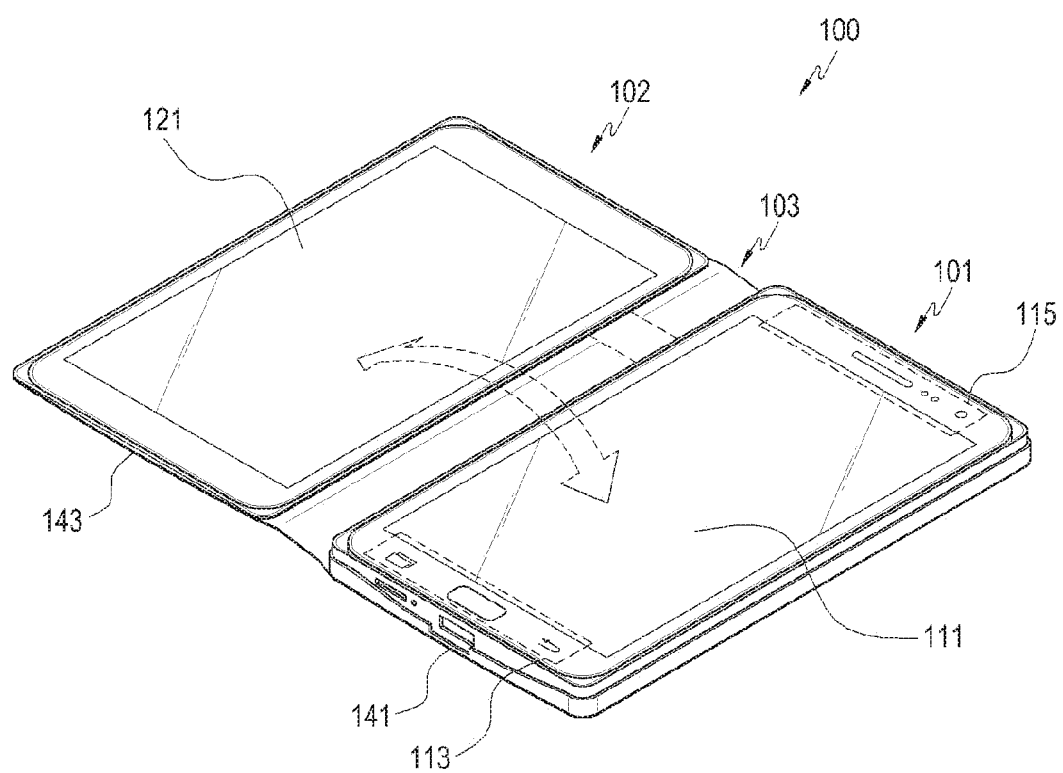
FIG. 1 is a perspective view of an electronic device according to various embodiments of the present disclosure.

Hereinafter, various embodiments of the present disclosure will be described with reference to the accompanying drawings. However, it should be understood that the present disclosure is not limited to the particular forms disclosed herein, rather, the present disclosure should be construed to cover various modifications, equivalents, and/or alternatives of embodiments of the present disclosure. In describing the drawings, similar reference numerals may be used to designate similar constituent elements.

In the present disclosure, the expressions "A or B", "at least one of A or/and B", or "one or more of A or/and B" may include all possible combinations of the items listed. For example, the expressions "A or B", "at least one of A and B", or "at least one of A or B" refer to all of (1) including at least one A, (2) including at least one B, or (3) including all of at least one A and at least one B.

The expressions "a first", "a second", "the first", or "the second" used in various embodiments of the present disclosure may modify various components regardless of the order and/or the importance but do not limit the corresponding components. For example, a first user device and a second user device refer to different user devices although both of them are user devices. For example, a first element may be referred to as a second element, and similarly, a second element may be referred to as a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposed between them. In contrast, it is understood that when an element (e.g., first element) is referred to as being "directly connected," or "directly coupled" to another element (second element), there are no elements (e.g., third element) interposed between them.

The expression "configured to" used in the present disclosure may be used interchangeably with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may refer to a dedicated processor (e.g. embedded processor) only for performing the corresponding operations or a general-purpose processor (e.g., central processing unit (CPU) or application processor (AP)) that may perform the corresponding operations by executing one or more software programs stored in a memory device.

In the present disclosure, the terms are used to describe specific embodiments, and do not limit the present disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not exclude the existence or probability of addition of one or more features, numerals, steps, operations, structural elements, parts, or combinations thereof.

Unless defined differently, all terms used herein, which include technical terms or scientific terms, have the same meanings as those commonly understood by a person skilled in the art to which the present disclosure pertains. Such terms as those defined in a generally used dictionary are to be interpreted to have the same meanings as the contextual meanings in the relevant field of art, and are not to be interpreted to have ideal or excessively formal meanings unless clearly defined in the present specification. In some cases, even terms defined in the present disclosure should not be interpreted to exclude embodiments of the present disclosure.

In the present disclosure, an electronic device may be a random device, and the electronic device may be called a terminal, a portable terminal, a mobile terminal, a communication terminal, a portable communication terminal, a portable mobile terminal, a display device, and the like, and may include a touch panel.

For example, the electronic device may be a smartphone, a portable phone, a game player, a TV, a display unit, a heads-up display unit for a vehicle, a notebook computer, a laptop computer, a tablet Personal Computer (PC), a Personal Media Player (PMP), a Personal Digital Assistants (PDA), and the like. The electronic device may be implemented as a portable communication terminal which has a wireless communication function and a small size. Further, the electronic device may be a flexible device or a flexible display device.

The electronic device may communicate with an external electronic device, such as a server and the like, or perform an operation through interworking with the external electronic device. For example, the electronic device may transmit an image photographed by a camera and/or position information detected by a sensor unit to the server through a network. The network may be a mobile or cellular communication network, a Local Area Network (LAN), a Wireless Local Area Network (WLAN), a Wide Area Network (WAN), an Internet, a Small Area Network (SAN) and the like, but is not limited thereto.

In an effort to enhance the performance of an electronic device, a plurality of functional units (for example, main body parts having various electronic components embedded therein) may be connected to each other, thereby improving information storage capacity or processing speed. Further, the functions of the electronic device may also be diversely changed through the connection of the plurality of functional units.

For example, if the plurality of functional units are equipped with the same processor and memory, it is possible to effectively operate the electronic device and expand a storage capacity by distributing loads of applications that are executed through the electronic device. If the plurality of functional units are equipped with display devices, a user may search for and identify desired information through the plurality of screens. If one of the plurality of functional units is equipped with a display device, and another is equipped with a game controller, a user may conveniently play a game through the electronic device. If one of the plurality of functional units is equipped with an antenna device that enables access to various communication networks, and another is equipped with a communication module that performs communication through the antenna device, a user may access the networks through the electronic device even though there is a change in the environment of electric wave transmission.

Figure 2:
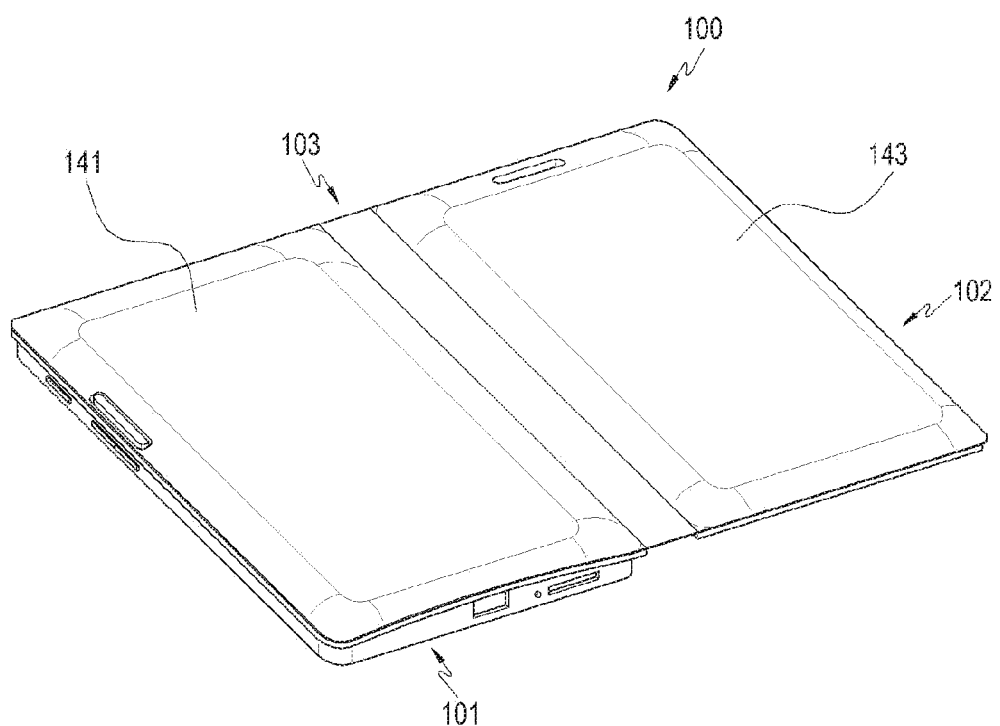
FIG. 2 is a perspective view illustrating the exterior of the electronic device according to various embodiments of the present disclosure.
Figure 3:
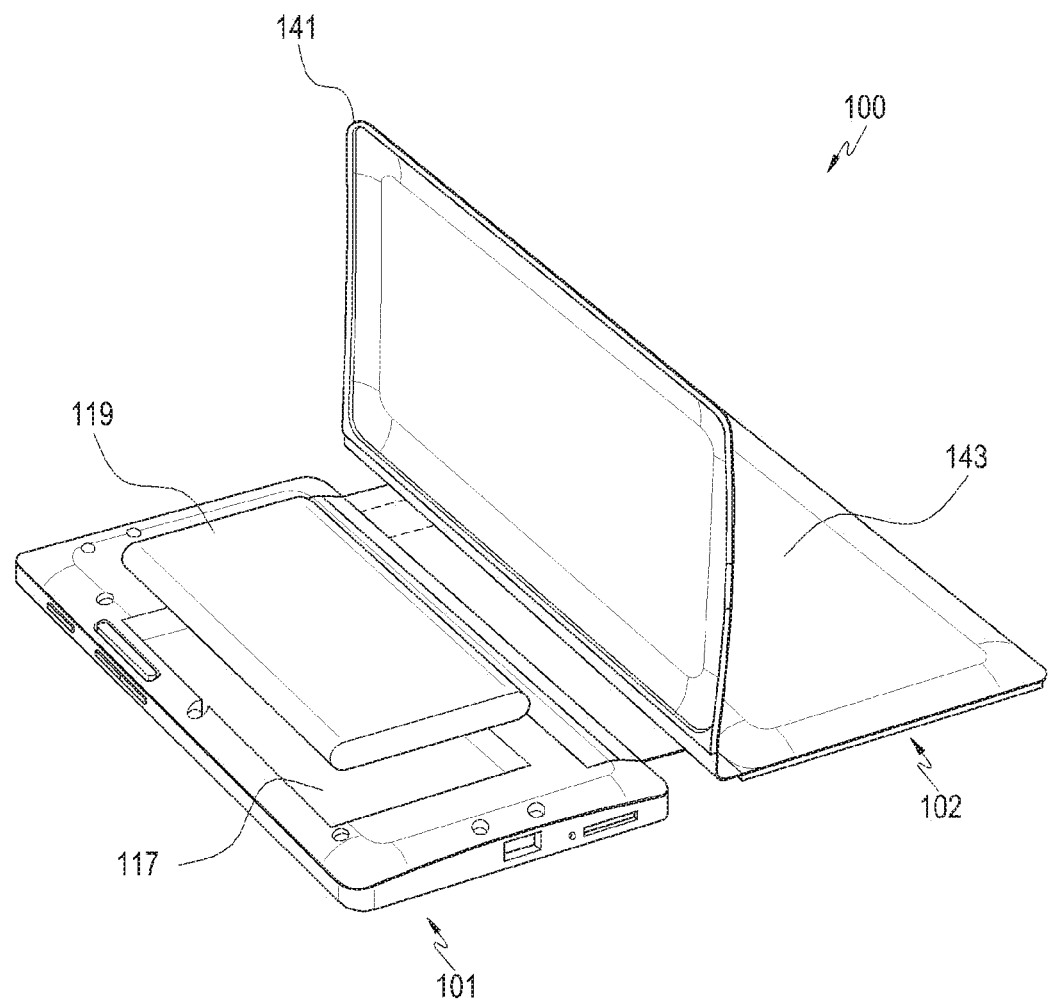
FIG. 3 is a perspective view illustrating an example of the use of the electronic device according to various embodiments of the present disclosure.

FIG. 1 is a perspective view of an electronic device 100 according to various embodiments of the present disclosure. FIG. 2 is a perspective view illustrating the exterior of the electronic device 100 according to various embodiments of the present disclosure. FIG. 3 is a perspective view illustrating an example of use of the electronic device 100 according to various embodiments of the present disclosure.

Referring to FIGS. 1 to 3, the electronic device 100, according to various embodiments of the present disclosure, includes functional units that are interconnected so as to be rotatable relative to each other, for example, first and second main body parts 101 and 102; and a connecting part 103 that rotatably connects the second main body part 102 to the first main body part 101.

The first main body part 101 may be equipped with various types of input/output devices, including a display device 111. For example, the display device 111 may be mounted on the front side of the first main body part 101, and a keypad region 113 and a call-receiving unit region 115 may be disposed on opposite sides (e.g., the upper and lower sides) of the display device 111. The display device 111, with a touch panel integrated therein, may be used as an input device. For example, the display device 111 may have a touch screen function so that an input device, such as a virtual keypad, etc., may be implemented through the display device 111. Keys used to operate the electronic device 100, such as a home key, a menu key, a back key, etc., may be disposed in the keypad region 113. A call-receiving unit used in a voice call and various types of sensors, such as a proximity sensor, an illumination sensor, a temperature/humidity sensor, etc., may be disposed in the call-receiving unit region 115. The sensors disposed in the call-receiving unit region 115 may detect the environment in which the electronic device 100 is used.

The second main body part 102 may be rotatably coupled to the first main body part 101 through the connecting part 103. For example, the connecting part 103 may have flexibility, and the second main body part 102 may be unfolded from the position where the second main body part 102 has been folded toward the first main body part 101, so as to be located in parallel on a side of the first main body part 101 or to be located on the back side of the first main body part 101. According to various embodiments of the present disclosure, the second main body part 102 may be unfolded at a predetermined angle relative to the first main body part 101 so as to be fixed in an inclined position. The operation of folding and unfolding the second main body part 102 will be described below in more detail.

The second main body part 102 may include a second display device 121 mounted on the front side thereof. The second display device 121, with a touch panel integrated therein, may also be used as an input device. The second display device 121 may operate in conjunction with the first display device 111, or may output a screen independently of the display device 111. For example, while the display device 111 outputs a video, etc., a user may search for and identify information on the output video through the second display device 121. Further, when a call, a message, and the like is received through the electronic device 100 while the display device 111 outputs a video, etc., information on the received call or message may be output through the second display device 121.

According to various embodiments of the present disclosure, the second main body part 102 may be equipped with the same electronic components (e.g., a processor, a memory, etc.) as those equipped in the first main body part 101 to distribute the load of applications that are executed on the first main body part 101. In cases where a game controller is equipped in the second main body part 102, a user may conveniently play a game using the game controller while viewing a screen that is output through the display device 111. In cases where the second main body part 102 is equipped with various antenna devices in order to connect to different communication networks, the electronic device 100 may select the proper antenna device equipped in the second main body part 102 to connect to a network. If the second main body part 102 is equipped with a solar battery, a wireless charging module, etc., the second main body part 102 may supply the power to the electronic device 100. Further, if the second main body part 102 is equipped with a keypad, a touchpad, a speaker module, a microphone module, etc., the second main body part 102 may be used to expand the input/output device of the electronic device 100. If the second main body part 102 is equipped with a fingerprint sensor, a gas sensor, etc., the second main body part 102 may improve a security function of the electronic device 100.

As described above, the electronic device 100, according to the various embodiments of the present disclosure, may include a plurality of functional units (e.g., the above-described first and second main body parts 101 and 102) and may enhance the operating performance thereof, or may expand the functions thereof by using at least one second main body part 102.

The connecting part 103 may be disposed between the first and second main body parts 101 and 102, and may include cover members 141 and 143 on which the first and second main body parts 101 and 102 are detachably provided, respectively. For example, the first cover member 141 on which the first main body part 101 is detachably provided may be disposed on a side of the connecting part 103, and the second cover member 143 on which the second main body part 102 is detachably provided may be disposed on the opposite side of the connecting part 103. The connecting part 103 may include an outer cover member. The outer cover member may be formed of at least one, or a combination of, flexible and durable materials, such as artificial leather, natural leather, silicone, urethane, fabric, etc. The outer cover member may be attached such that different portions thereof surround the outsides of the first and second cover members 141 and 143, respectively, and may rotatably connect the first and second cover members 141 and 143. According to various embodiments of the present disclosure, the first and second cover members 141 and 143 may be manufactured of the same flexible material as that of the outer cover, and may be directly attached to the first and second main body parts 101 and 102. The configuration of the outer cover member will be described below in more detail with reference to FIG. 8.

According to various embodiments of the present disclosure, the first cover member 141 may be attached to, and detached from, the first main body part 101. The first cover member 141 may continue to be connected to the second cover member 143 even in a state in which the first cover member 141 is separated from the first main body part 101. The first main body part 101 may have a battery mounting recess 117 formed in the rear surface thereof, and a battery 119 may be mounted in the battery mounting recess 117 to supply the power of the electronic device 100. The battery mounting recess 117 may be opened anti closed by the first cover member 141.

Figure 4:
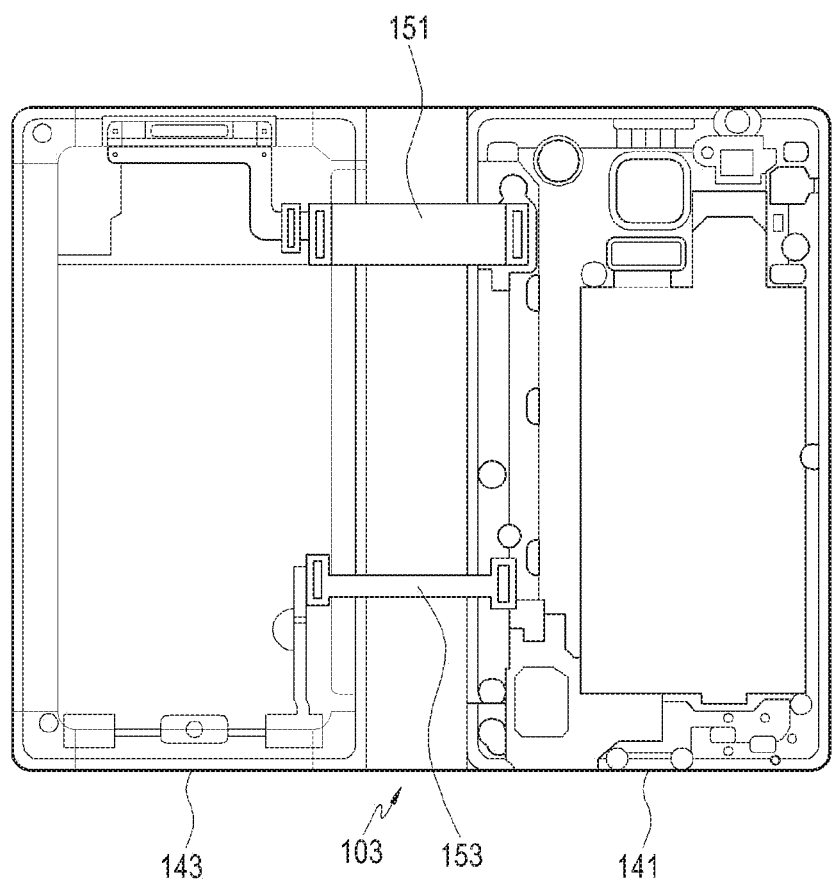
FIG. 4 is a view illustrating an example of an interconnection wiring structure of the electronic device according to various embodiments of the present disclosure.
Figure 5:
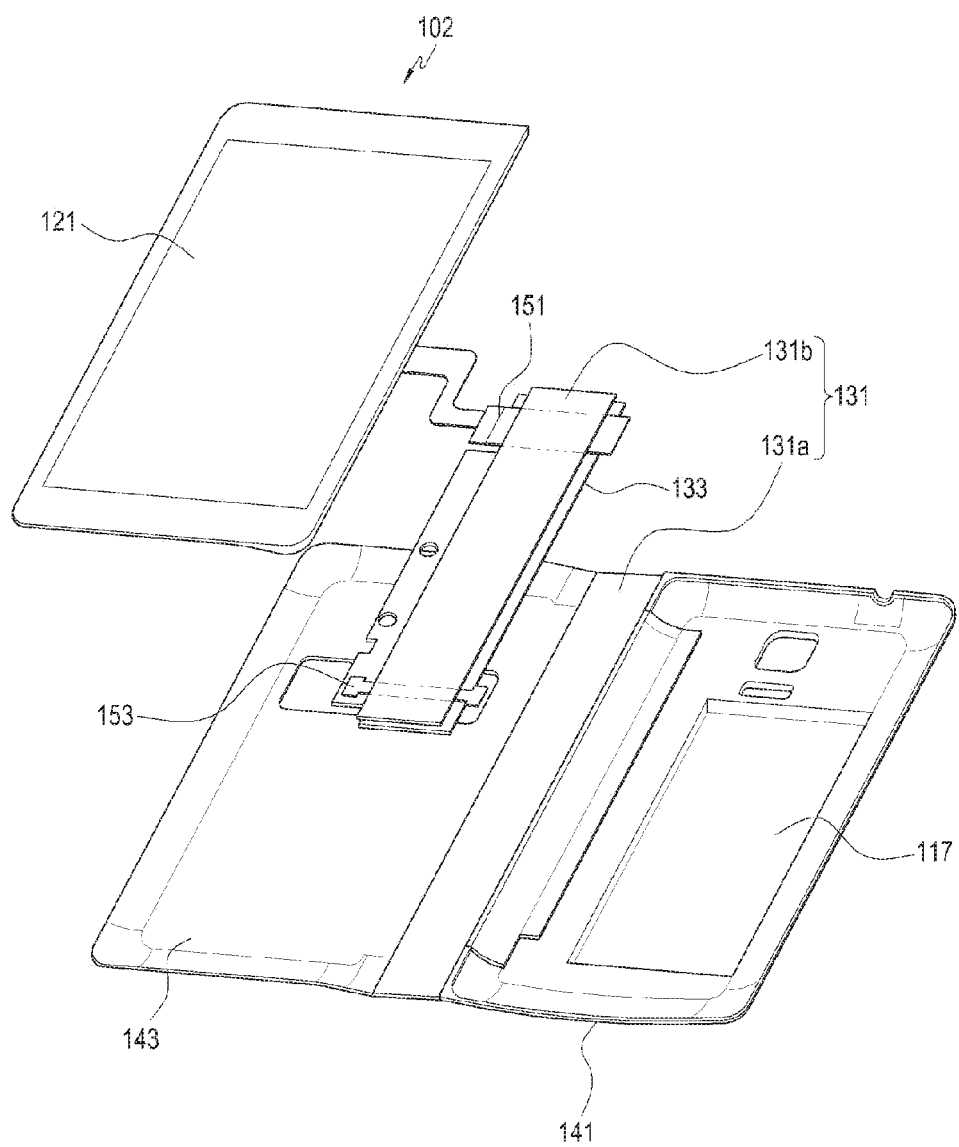
FIG. 5 is an exploded perspective view illustrating a part of the electronic device according to various embodiments of the present disclosure.

FIG. 4 is a view illustrating an example of an interconnection wiring structure of the electronic device 100 according to various embodiments of the present disclosure. FIG. 5 is an exploded perspective view illustrating a part of the electronic device.

Referring to FIGS. 4 and 5, the electronic device 100 includes Flexible Printed Circuit Boards (FPCBs) 151 and 153 that electrically connect the first and second main body parts 101 and 102. For example, the second main body part 102 may be mechanically and electrically connected to the first main body part 101 through the connecting part 103 that includes the FPCBs 151 and 153. The internal wiring of the FPCBs 151 and 153 may vary according to electronic components equipped in the first and second main body parts 101 and 102, for example, according to functions that may be performed through the first and second main body parts 101 and 102. According to an embodiment of the present disclosure, the internal wiring may be a structure in which a plurality of FPCBs are stacked on each other. The FPCBs 151 and 153 may include a shielding layer for shielding electromagnetic waves, a ground layer, etc.

According to various embodiments of the present disclosure, the connecting part 103 may include connecting member(s) 131a and 131b that at least partially surround the FPCBs 151 and 153. The connecting member(s) 131a and 131b may connect the first and second main body parts 101 and 102 such that the first and second main body parts pivot relative to each other, and the FPCBs 151 and 153 may electrically connect the first and second main body parts 101 and 102. The connecting member(s) 131a and 131b may be manufactured of a flexible material, and the connecting part 103 may further include a shape memory member 133 to maintain the second main body part 102 to be obliquely unfolded at a predetermined angle relative to the first main body part 101. The configuration of the connecting part 103 will be described below in more detail with reference to at least FIG. 8.

Figure 6:
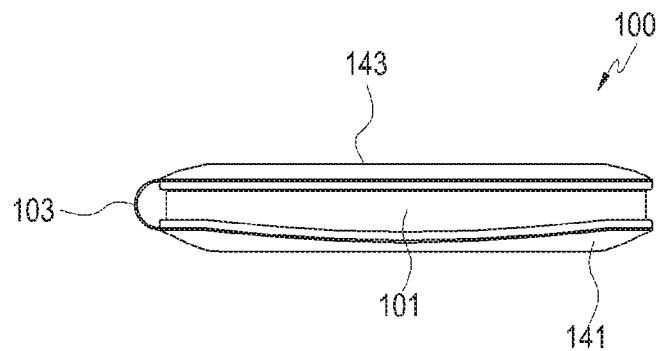
FIG. 6 is a side view illustrating functional units of the electronic device, according to various embodiments of the present disclosure, which have been folded toward each other.
Figure 7:
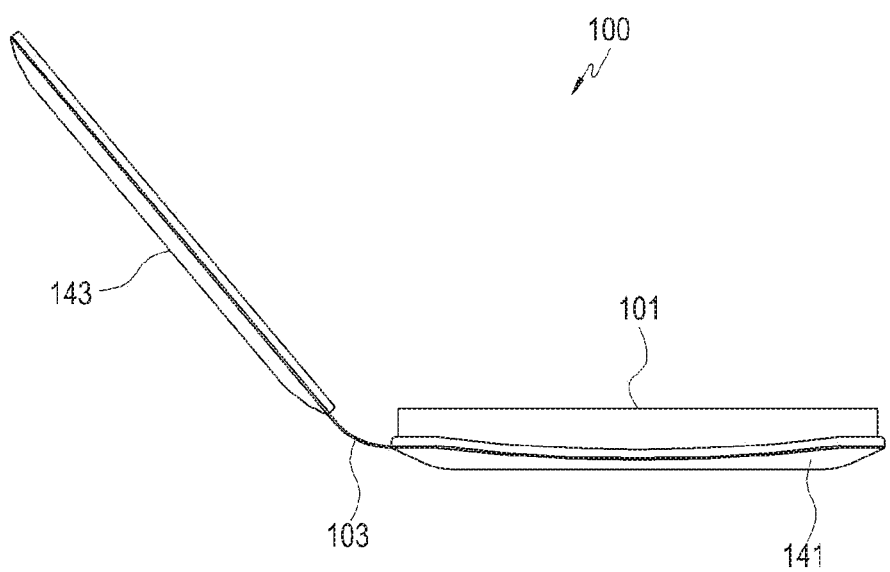
FIG. 7 is a side view illustrating the functional units of the electronic device, according to various embodiments of the present disclosure, which have been unfolded away from each other.

FIG. 6 is a side view illustrating the functional units of the electronic device 100, according to various embodiments of the present disclosure, which have been folded toward each other. FIG. 7 is a side view illustrating the functional units of the electronic device 100, which have been unfolded away from each other.

Referring to FIGS. 6 and 7, the functional units of the electronic device 100, for example, the first and second main body parts 101 and 102 are folded to face each other, or the second main body part 102 may pivot relative to the first main body part 101 so as to be unfolded away from the first main body part 101. Since the connecting part 103 is flexible, the angle by which the second main body part 102 is unfolded away from the first main body part 101 may not be restricted. In cases where the connecting part 103 includes the shape memory member 133 as described above, the second main body part 102 may be fixed while being obliquely unfolded a predetermined angle (e.g., 150 degrees) away from the first main body part 101. The angle at which the second main body part 102 is fixed to be inclined with respect to the first main body part 101 may be properly adjusted by a user.

Hereinafter, the connecting part will be described with reference to FIG. 8. It should be noted that in the following detailed description, elements that are similar to those of the preceding embodiment, may be provided with the same reference numerals, or no reference numerals, and detailed descriptions thereof may also be omitted. Further, it should be noted that elements disclosed in a different embodiment may be omitted in some drawings or embodiments, which is done for brevity of the drawings or detailed description. For example, even though not mentioned in one embodiment, element(s) mentioned in a different embodiment may be combined with the embodiment in which the corresponding element(s) are not mentioned.

Figure 8:
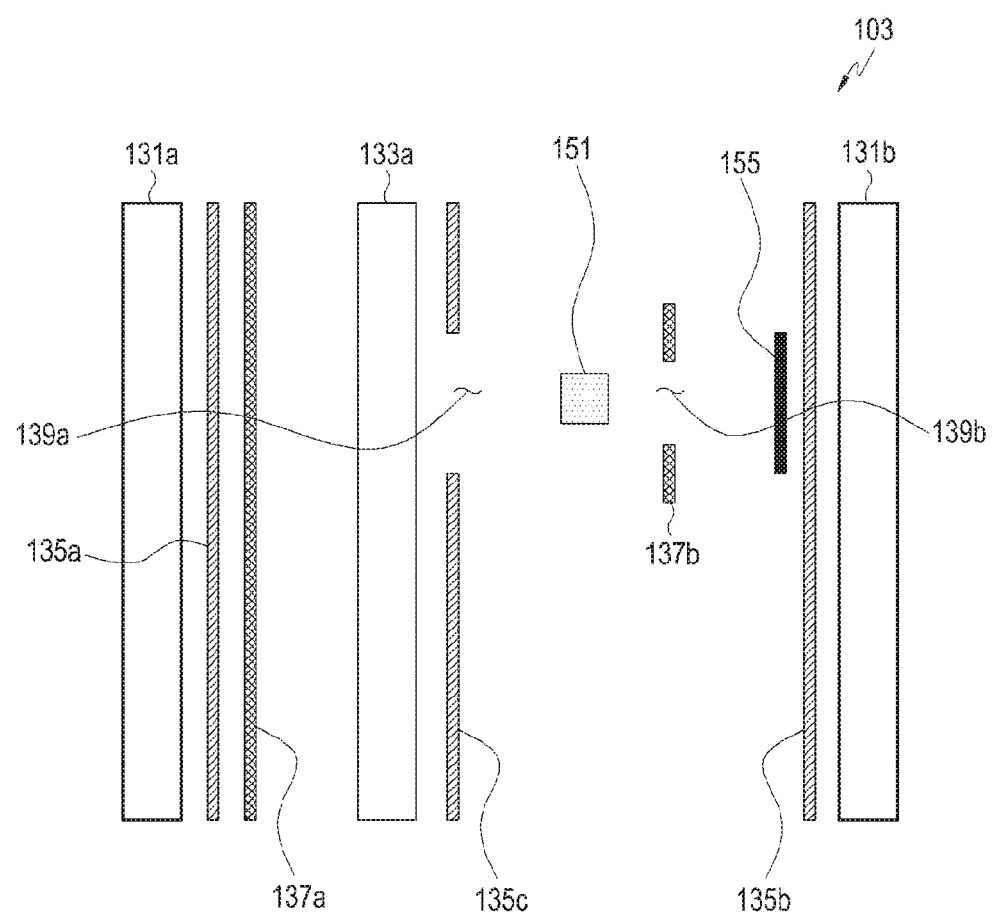
FIG. 8 is a cross-sectional view illustrating a connecting part of the electronic device according to various embodiments of the present disclosure.
Figure 9:
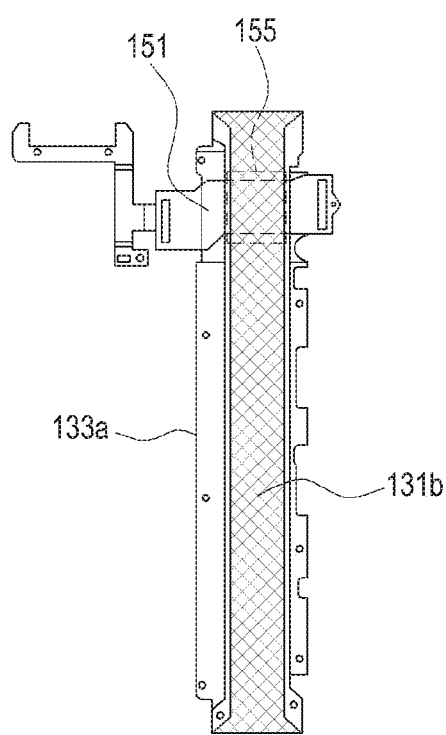
FIGS. 9 and 10 are a top plan view and a bottom view illustrating a part of the connecting part of the electronic device according to various embodiments of the present disclosure.
Figure 10:
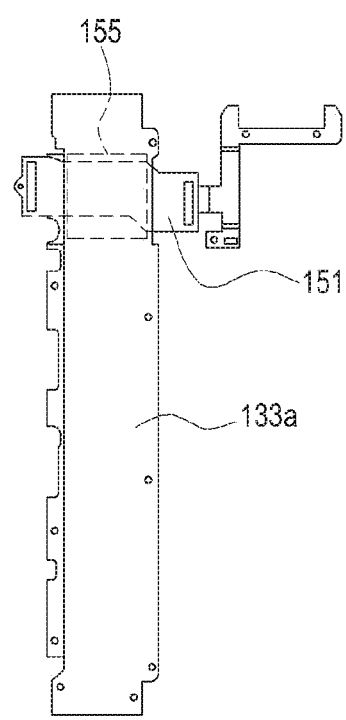

FIG. 8 is a cross-sectional view illustrating the connecting part 103 of the electronic device 100 according to various embodiments of the present disclosure. FIGS. 9 and 10 are a top plan view and a bottom view illustrating a part of the connecting part of the electronic device 100. It should be noted that among the configuration of the connecting part 103 illustrated in FIG. 8, the outer cover member 131a is omitted in FIGS. 9 and 10.

Referring to FIGS. 8 to 10, the connecting part 103 includes the outer cover member 131a and the inner cover member 131b as the connecting members, and the FPCB 151 may be disposed between the outer and inner cover members 131a and 131b. The outer and inner cover members 131a and 131b may be manufactured of a flexible material, for example, at least one, or a combination of two or more, of natural leather, artificial leather, fabric, rubber, urethane, silicone, etc.

The outer cover member 131a may be located on the exterior of the connecting part 103 to constitute a part of the external appearance of the electronic device 100. The inner cover member 131b may be located on the inside of the connecting part 103 so as to be exposed to the outside when the second main body part 102 is unfolded. For example, the external appearance of the connecting part 103 may be implemented by the outer and inner cover members 131a and 131b, and the inner cover member 131b may be selectively exposed according to folding or unfolding of the second main body part 102.

The FPCB 151 may be at least partially surrounded by the connecting member(s) 131a and 131b, for example, the outer cover member 131a and the inner cover member 131b. Since the outer and inner cover members 131a and 131b may be manufactured of a flexible material, in cases where the FPCB 151 partially overlaps the outer and inner cover members 131a and 131b, the outsides of the outer and inner cover members 131a and 131b may protrude from the wiring portion of the FPCB 151. The connecting part 103 may include a reinforcing member 155 or a shape memory member 133a to prevent a partial protrusion from the outsides of the outer and inner cover members 131a and 131b.

The reinforcing member 155 may be formed of a synthetic resin film, for example, a polycarbonate or polyethyleneterephthalate film, and may at least partially overlap the FPCB 151 on the outer cover member 131a or the inner cover member 131b. The reinforcing member 155 may have a larger width than the FPCB 151. For example, if the FPCB 151 has a width of about 12 mm, the reinforcing member 155 may have a width of about 24 mm. For example, on the connecting members 131a and 131b, the FPCB 151 may be located to face the inner cover member 131b with the reinforcing member 155 in between.

A difference in thickness between the portion where the FPCB 151 is disposed and the portion where the FPCB 151 is not disposed on the outside of the outer or inner cover member 131a or 131b (in this embodiment, the outside of the inner cover member 131b) may be gradually reduced by disposing the reinforcing member 155. For example, if the FPCB 151 has a thickness of 0.09 mm, there may be a difference in thickness of about 0.09 mm between the portion where the FPCB 151 is disposed and the portion where the FPCB 151 is not disposed. The reinforcing member 155 that has a larger width than the FPCB 151 may make the thickness of the connecting part 103 gradually decrease away from the edge of the portion where the FPCB 151 is disposed, thereby concealing the thickness difference (e.g., the protruding portion due to the arrangement of the FPCB 151).

The shape memory member 133a may be constructed of a hinge module that has a mechanism, or may be manufactured of a shape memory material, a shape memory plastic, a shape memory alloy, etc., and may maintain the second main body part 102 to be obliquely unfolded at a predetermined angle relative to the first main body part 101. The shape memory member 133a may be interposed between the outer cover member 131a and the FPCB 151, and when a predetermined magnitude of force is applied thereto, the shape memory member 133a may maintain the deformed state caused by the force. According to various embodiments of the present disclosure, the shape memory member 133a may be used as a reinforcing member that conceals the thickness difference due to the arrangement of the FPCB 151. The shape memory member 133a is illustrated as being interposed between the outer cover member 131a and the FPCB 151, and the reinforcing member 155 is illustrated as being interposed between the FPCB 151 and the inner cover member 131b.

Since the FPCB 151 also has flexibility, the outer and inner cover members 131a and 131 b and the FPCB 151 may be deformed to have different curvatures according to folding or unfolding of the second main body part 102. For example, while the first and second main body parts 101 and 102 are unfolded away from each other to form an angle of 180 degrees as illustrated in FIG. 1, the outer and inner cover members 131a and 131b and the FPCB 151 may be maintained in the same flat shape. In a state in which the second main body part 102 is folded toward the first main body part 101, or is fixed to be inclined relative to the first main body part 101 as illustrated in FIGS. 6 and 7, the curvatures of the outer and inner cover members 131a and 131b and the FPCB 151 may differ from each other. For example, the curvature of the outer cover member 131a may be larger than that of the inner cover member 131b or the FPCB 151 in the state illustrated in FIG. 6 or 7.

A tension may be applied to the FPCB 151 as a result of the deviation of the curvatures that are generated when the second main body part 102 is folded or unfolded. The electronic device 100, according to the various embodiments of the present disclosure, may make the FPCB 151 deform independently of the outer or inner cover member 131a or 131b, or the shape memory member 133a or the reinforcing member 155, thereby preventing the tension from being applied to the FPCB 151.

In the arrangement of the FPCB 151 between the outer and inner cover members 131a and 131b, an adhesive is not applied to the region of the outer or inner cover member that the FPCB 151 directly faces so that the FPCB 151 may deform and move independently of the outer or inner cover member 131a or 131b. This configuration will be described again with reference to FIG. 8.

The connecting part 103 may further include thermal compression layer(s) 135a, 135b, and 135c and bonding layer(s) 137a and 137b in order to bond the outer cover member 131a and the shape memory member 133a, the shape memory member 133a and the inner cover member 131b, and the reinforcing member 155 and the inner cover member 131b. Among the thermal compression layer(s) 135a, 135b, and 135c and the bonding layer(s) 137a and 137b, the thermal compression layer(s) and the bonding layer(s) that are disposed between the shape memory member 133a and the inner cover member 131b or between the shape memory member 133a and the reinforcing member 155 may have slots 139a and 139b for accommodating the FPCB 151.

The first thermal compression layer 135a may be provided in order to bond the outer cover member 131a and the shape memory member 133a while they face each other. The shape memory member 133a may be bonded to the outer cover member 131a while the first thermal compression layer 135a is being formed by heating and melting the adhesive tape attached to one surface (e.g., the inside) of the outer cover member 131a and then pressing the shape memory member 133a that faces the adhesive tape.

The first bonding layer 137a may be further interposed between the outer cover member 131a and the shape memory member 133a. The first bonding layer 137a may be formed on one surface of the shape memory member 133a, and the shape memory member 133a may be bonded to the outer cover member 131a or the first thermal compression layer 135a and may be maintained in a gel state that has no resilience. For example, the first bonding layer 137a may be used to bond the shape memory member 133a to the outer cover member 131a, and enable the shape memory member 133a to slide relative to the outer cover member 131a while facing the outer cover member 131a. As a result, the first bonding layer 137a may prevent the outer cover member 131a and the shape memory member 133a from applying a tension to the counterpart even though the outer cover member 131a and the shape memory member 133a have different curvatures when the second main body part 102 is folded or unfolded. For example, the first bonding layer 137a may prevent the outer cover member 131a, which is relatively flexible, from being corrugated or permanently deformed by an excessive tension.

The second thermal compression layer 135b may be provided between the inner cover member 131b and the reinforcing member 155. Similar to the first thermal compression layer 135a, the second thermal compression layer 135b may be used to bond the reinforcing member 155 and/or the shape memory member 133a to the inner cover member 131b by heating the adhesive tape attached to the inside of the inner cover member 131a. According to various embodiments of the present disclosure, in order to bond the shape memory member 133a to the inner cover member 131b, another application of heating the adhesive tape may be provided on another surface of the shape memory member 133a to form the third thermal compression layer 135c.

Even though the FPCB 151 is interposed between the shape memory member 133a and the reinforcing member 155, the reinforcing member 155 may partially face the shape memory member 133a because the width of the reinforcing member 155 is larger than that of the FPCB 151. The second bonding layer 137b may be disposed in the region where the reinforcing member 155 partially faces the shape memory member 133a. The slots 139a and 139b may be formed in the third thermal compression layer 135c and the second bonding layer 137b, respectively, to accommodate the FPCB 151. The FPCB 151 may be disposed between the shape memory member 133a and the inner cover member 131b, for example between the shape memory member 133a and the reinforcing member 155, to be spaced apart from the third thermal compression layer 135c or the second bonding layer 137b. For example, the FPCB 151 may be disposed in the slots 139a and 139b, and the edge of the FPCB 151 may be spaced apart from the third thermal compression layer 135c or the second bonding layer 137b.

The slot 139a formed in the third thermal compression layer 135c may have a larger width than the FPCB 151 or the reinforcing member 155. For example, the slot 139a may have a width of about 25 mm. Accordingly, the reinforcing member 155 or the FPCB 151 may freely move relative to the shape memory member 133a without being fixed to the shape memory member 133a. For example, it is possible to restrain a tension from being applied to the reinforcing member 155 or the FPCB 151 due to a curvature deviation even though the curvature of the connecting part 103 varies.

The second bonding layer 137b may be located such that one portion faces the connecting member, for example, the inner cover member 131b, and the rest faces the inner cover member 131b with the reinforcing member 155 in between. The second bonding layer 137b may be formed on the reinforcing member 155 along the edge of the reinforcing member 155 and may have the slot 139b formed therein.

The slot 139b formed in the second bonding layer 137b may have a width that is smaller than that of the reinforcing member 155 and is larger than that of the FPCB 151. For example, the slot 139b may have a width of about 16 mm. Accordingly, the FPCB 151 may freely move relative to the reinforcing member 155 without being fixed to the reinforcing member 155. For example, it is possible to restrain a tension from being applied to the FPCB 151 due to a curvature deviation even though the curvature of the connecting part 103 varies. Further, the second bonding layer 137b may make the reinforcing member 155 slide relative to the shape memory member 133a in the shear direction. For example, the second bonding layer 137b may prevent tension from being applied to the reinforcing member 155 or the shape memory member 133a due to a curvature deviation even through the curvature of the connecting part 103 varies, and may prevent the reinforcing member 155 or the shape memory member 133a from being deformed (e.g., corrugated) by the tension.

As described above, even though there is a difference in thickness due to the arrangement of the FPCB in the configuration of the connecting part that is deformed in the shape of a curved surface, the electronic device, according to the various embodiments of the present disclosure, may conceal the difference in thickness on the external appearance of the electronic device (for example the connecting part) by using the reinforcing member (the shape memory member may also be an example of the reinforcing member). In addition, the connecting part of the electronic device may include the plurality of members (e.g., the outer cover member, the inner cover member, the shape memory member, the reinforcing member, etc.) that have different resilience or rigidity and are bonded to face each other and the bonding layers that are disposed in the proper positions. When the plurality of members, which have been described above, are deformed, the bonding layers may cause a relative displacement in between the members, thereby preventing a tension or corrugation from being generated by a curvature deviation.

Figure 11:
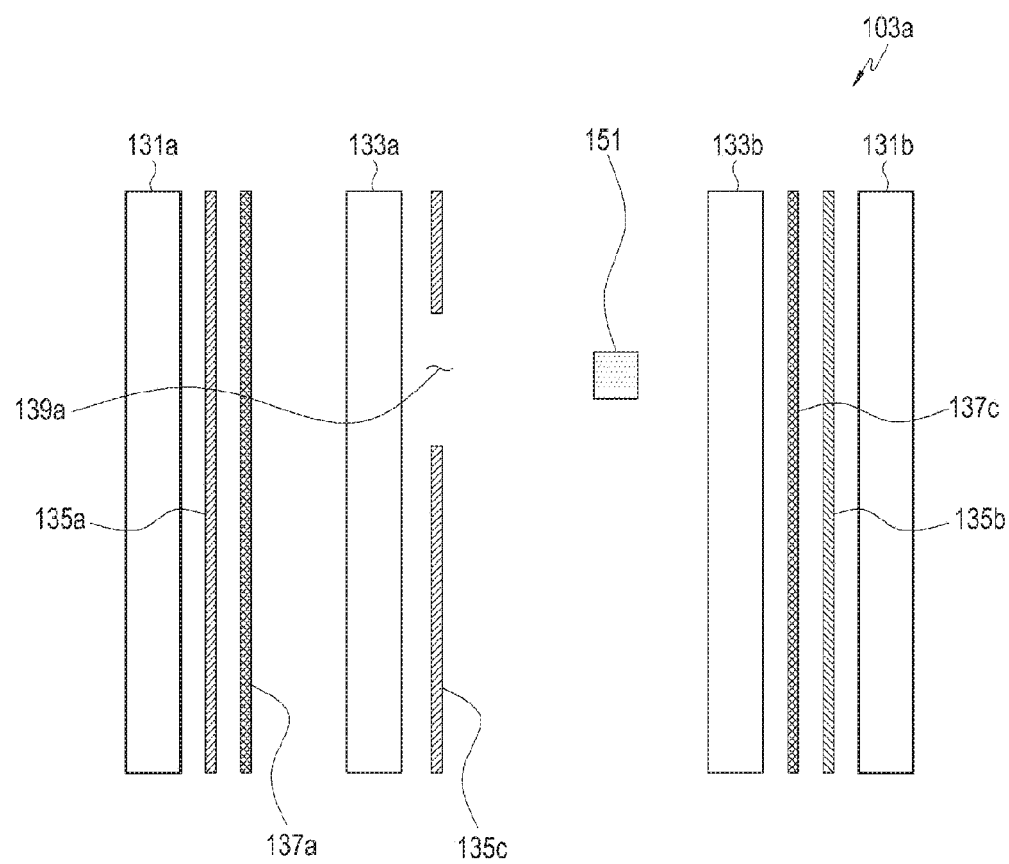
FIG. 11 is a cross-sectional view illustrating a modified example of the connecting part of the electronic device according to various embodiments of the present disclosure.

FIG. 11 is a cross-sectional view illustrating a modified example of the connecting part of the electronic device according to various embodiments of the present disclosure.

The connecting part 103a differs from the preceding embodiment in that the reinforcing member 155 of the above-described embodiment is implemented by another shape memory member. For example, a second shape memory member 133b may be disposed inside an inner cover member 131b, and an FPCB 151 may be disposed between a shape memory member 133a and the second shape memory member 133b.

The shape memory member 133a and the second shape memory member 133b may conceal a protrusion that protrudes from the exterior of an outer or inner cover member 131a or 131b due to a difference in thickness that is generated on the wiring portion of the FPCB 151. The second shape memory member 133b may be formed of the same material (e.g., a shape memory plastic, a shape memory alloy, etc.) as the shape memory member 133a. However, the present disclosure is not limited thereto, and the second shape memory member 133b may be formed of a different material from the shape memory member 133a as long as the material may be maintained to be deformed by a predetermined force applied thereto.

A second thermal compression layer 135b and a second bonding layer 137c may be disposed between the inner cover member 131b and the second shape memory member 133b in a manner similar to that in which a first thermal compression layer 135a and a first bonding layer 137a are disposed between the outer cover member 131a and the shape memory member 133a. The second thermal compression layer 135b and the second bonding layer 137c may be used to bond the second shape memory member 133b to the inner cover member 131b, and may cause a displacement of the second shape memory member 133b relative to the inner cover member 131b. Accordingly, even though a curvature deviation is generated between the inner cover member 131b and the second shape memory member 133b when the electronic device 100 is folded or unfolded, it is possible to prevent the inner cover member 131b from being corrugated by a tension.

A third thermal compression layer 135c may be disposed between the shape memory member 133a and the second shape memory member 133b. For example, the shape memory member 133a and the second shape memory member 133b may be bonded to each other while facing each other. The third thermal compression layer 135c may have a slot 139a formed therein for accommodating the FPCB 151. The slot 139a may have a width of, for example, about 16 mm or about 25 mm that is larger than that of the FPCB 151, so that the FPCB 151 may be disposed in the slot 139a while being spaced apart from the third thermal compression layer 135c. Accordingly, the FPCB 151 may freely move relative to the shape memory members 133a and 133b while being disposed in between. For example, the FPCB 151 may be deformed in a suitable shape in response to the folding or unfolding of the electronic device 100, thereby preventing damage caused by an external force (e.g., a tension).

Figure 12:
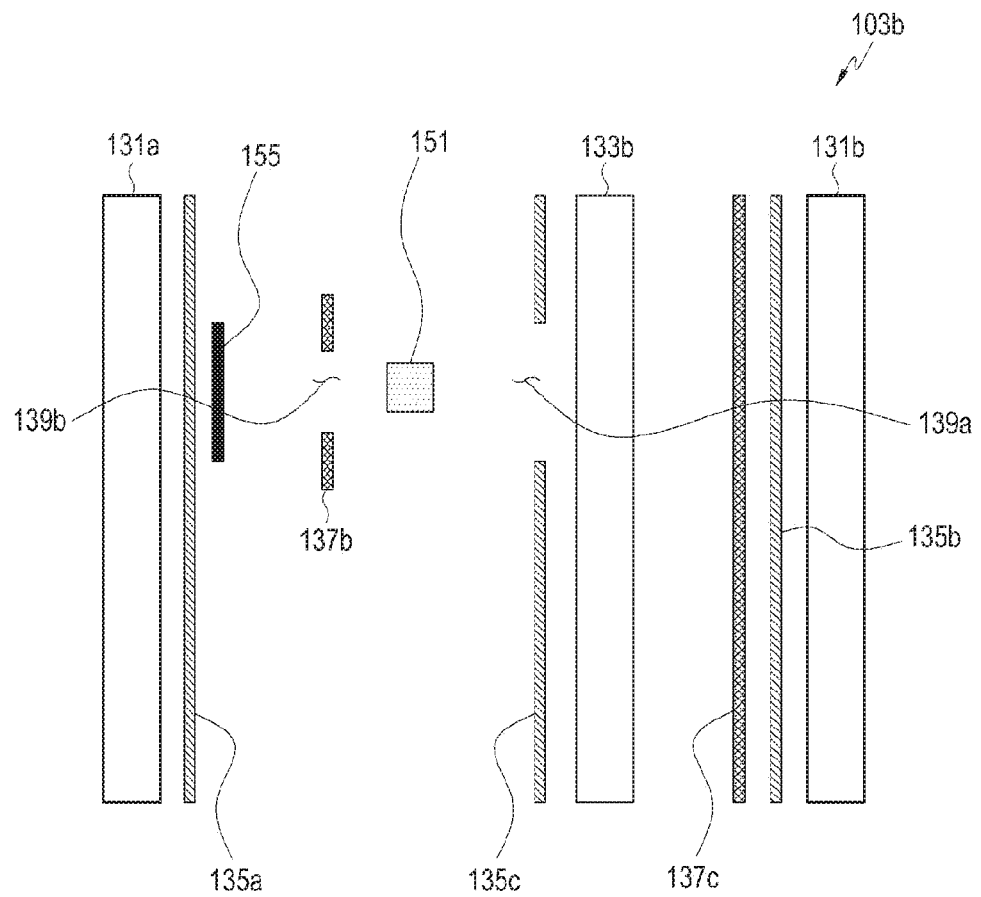
FIG. 12 is a cross-sectional view illustrating another modified example of the connecting part of the electronic device according to various embodiments of the present disclosure.

FIG. 12 is a cross-sectional view illustrating another modified example of the connecting part of the electronic device according to various embodiments of the present disclosure.

The connecting part 103b of the electronic device, includes a reinforcing member 155 that is bonded to an outer cover member 131a and a shape memory member 133b that is bonded to an inner cover member 131b. Since structures for bonding the reinforcing member 155 and the shape memory member 133b to each other, or to the outer or inner cover member 131a or 131b, are similar to those in the embodiment illustrated in FIG. 8, detailed descriptions thereof will be omitted.

The shape memory member 133b may have a larger thickness than the reinforcing member 155. For example, an FPCB 151 may have a larger radius of curvature while the electronic device 100 is folded, compared with that of the preceding embodiment. Since the FPCB 151 may maintain a larger radius of curvature even though the FPCB 151 is deformed, the durability or reliability of the FPCB 151 may also be enhanced in a structure in which the folding/ unfolding angle of the first and second main body parts 101 and 102 is set to be large, for example, in a structure in which the first and second main body parts 101 and 102 may be unfolded away from each other to an angle of 180 degrees from the position where the first and second main body parts are folded toward each other.

Figure 13:
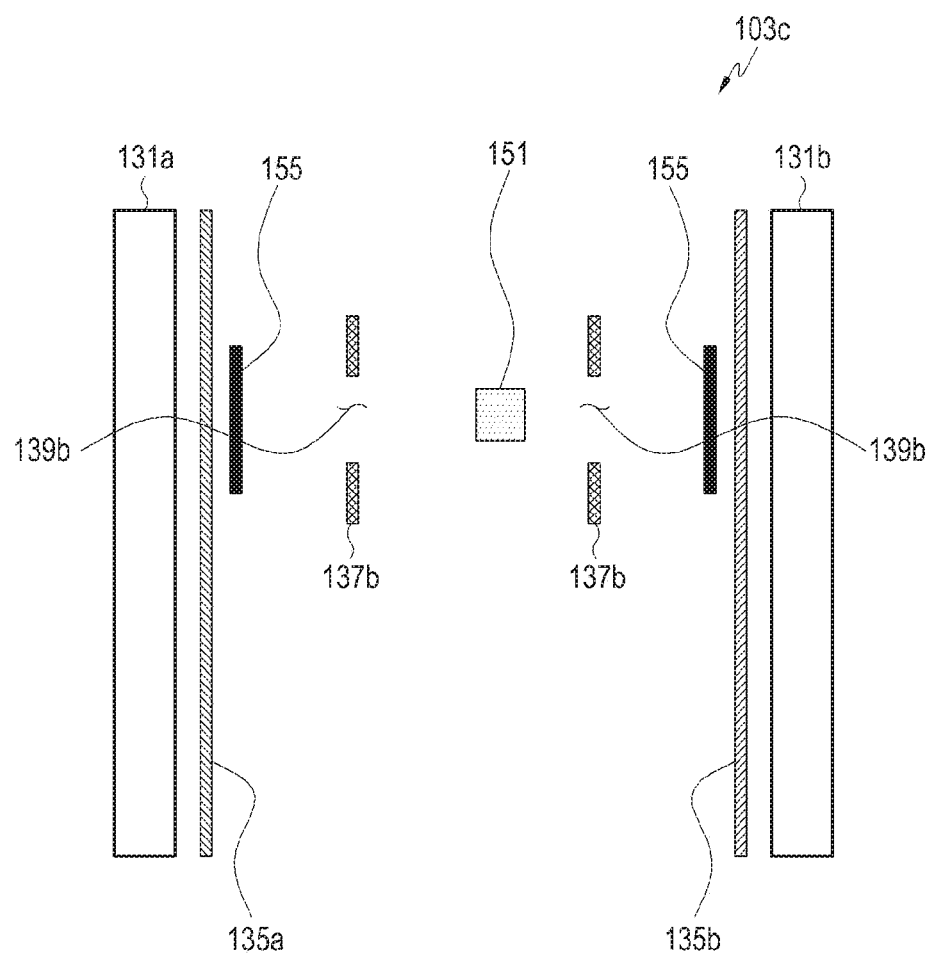
FIG. 13 is a cross-sectional view illustrating another modified example of the connecting part of the electronic device according to various embodiments of the present disclosure.

FIG. 13 is a cross-sectional view illustrating another modified example of the connecting part of the electronic device 100 according to various embodiments of the present disclosure.

Referring to FIG. 13, the connecting part 103c includes reinforcing members 155 that are disposed between an FPCB 151 and an outer cover member 131a and between the FPCB 151 and an inner cover member 131b, instead of the shape memory members of the preceding embodiments, thereby preventing a tension that may be applied to the FPCB 151 when the electronic device is folded or unfolded. The connecting part 103c may include thermal compression layers 135a and 135b in order to bond the reinforcing members 155 to the outer and inner cover members 131 and 131b and to bond the outer and inner cover members 131a and 131b to each other while the outer and inner cover members face each other. The reinforcing members 155 may be located to face each other with the FPCB 151 in between, and at least one bonding layer(s) 137b may be interposed between the reinforcing members 155. For example, the reinforcing members 155 may be bonded to the outer and inner cover members 131a and 131b, respectively, to conceal a difference in thickness of the wiring portion of the FPCB 151 from the outside of the connecting part 103c. Further, the reinforcing members 155 may be displaced relative to each other because the reinforcing members 155 are disposed to face each other with the bonding layer(s) 137b in between.

Since the connecting part 103c does not include a shape memory member, the outer and inner cover members 131a and 131b may freely deform. For example, the connecting part 103c may be applied to an electronic device in which the inclined angle between the first and second main body parts 101 and 102 does not need to be fixed.

Figure 14:
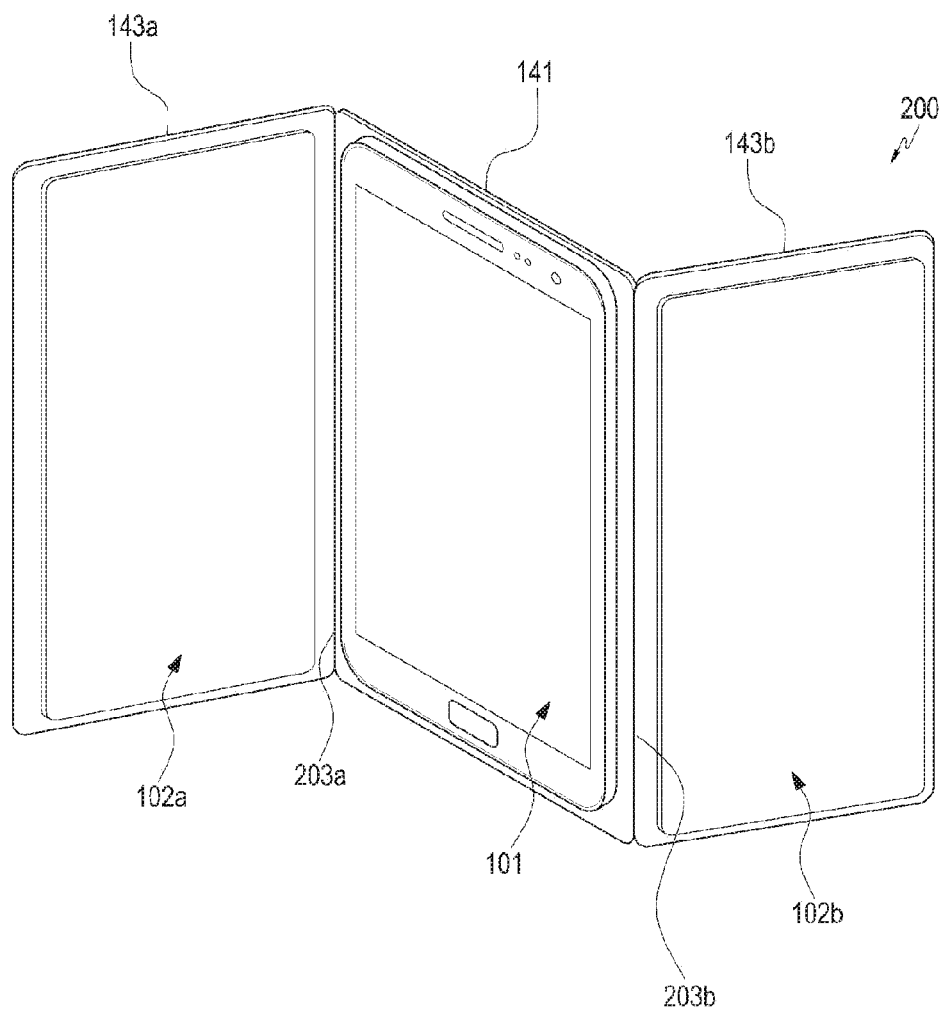
FIG. 14 is a perspective view of an electronic device according to various embodiments of the present disclosure.

FIG. 14 is a perspective view of an electronic device 200 according to another of the various embodiments of the present disclosure.

Referring to FIG. 14, the electronic device 200, according to an embodiment of the present disclosure, includes second main body parts 102a and 102b that are disposed on opposite sides of a first main body part 101. In the following description, the second main body parts are distinguished into the second main body part 102a and the third main body part 102b. However, the present disclosure is not limited thereto. The second and third main body parts 102a and 102b may be detachably provided on first and second cover members 143a and 143b and may be connected to the first main body part 101 through first and second connecting parts 203a and 203b. The first and second connecting parts 203a and 203b may be implemented by connecting parts 103, 103a, 103b, and 103c of the above-described embodiments. The second and third main body parts 102a and 102b may be mechanically or electrically connected to the first main body part 101 through the first and second connecting parts 203a and 203b.

Figure 15:
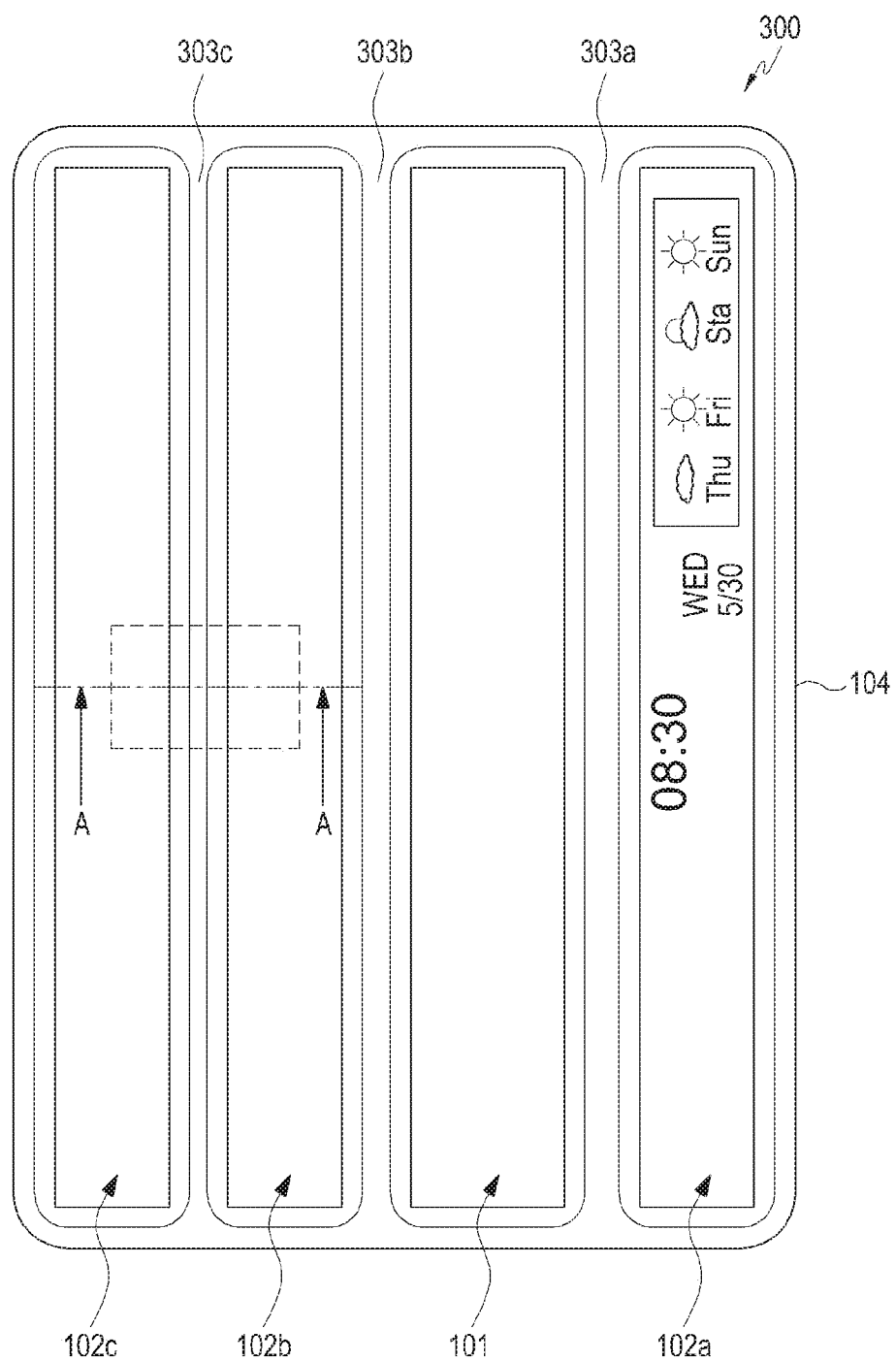
FIG. 15 is a perspective view of an electronic device according to various embodiments of the present disclosure.
Figure 16:
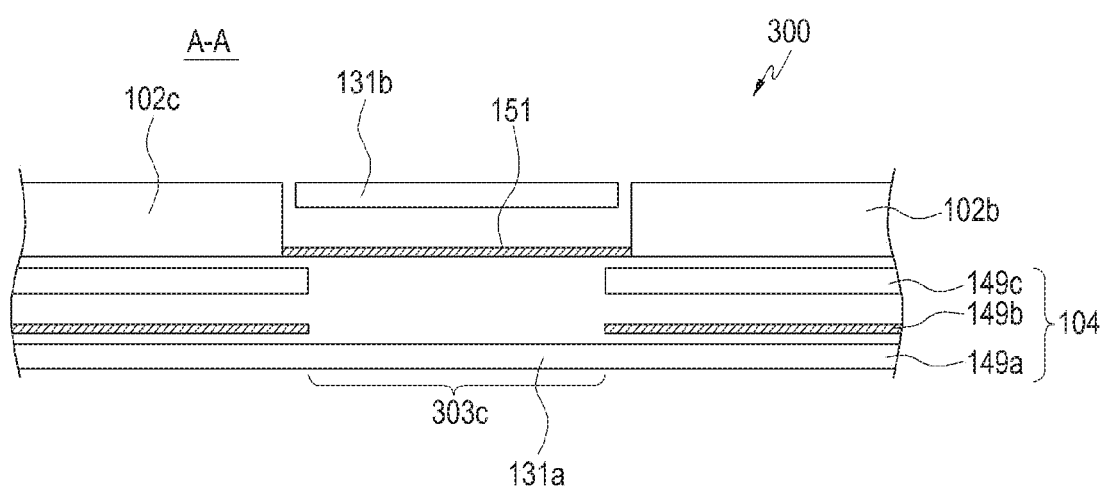
FIG. 16 is a partial cutaway sectional view of the electronic device according to various embodiments of the present disclosure.

FIG. 15 is a perspective view of an electronic device 300 according to an embodiment of the present disclosure. FIG. 16 is a partially cutaway sectional view of the electronic device 300 according to an embodiment of the present disclosure.

The electronic device 300, according to the embodiment of the present disclosure, includes a first main body part 101 and a plurality of second main body parts 102a, 102b, and 102c. The second main body parts 102a, 102b, and 102c may be connected to the first main body part 101, or may be connected to the second main body part adjacent thereto. The electronic device 300 includes a plurality of connecting parts 303a, 303b, and 303c, and the second main body parts 102a, 102b, and 102c may be connected to the first main body part 101 or the second main body part adjacent thereto through connecting parts 303a, 303b, and 303c. The connecting parts 303a, 303b, and 303c may be implemented by connecting parts 103, 103a, 103b, and 103c of the above-described embodiments. However, it should be noted that some elements (e.g., a reinforcing member, a bonding layer, etc.) are omitted in FIG. 16.

The first and second main body parts 101, 102a, 102b, and 102c may have the same or different functions. The first main body part 101 may have a communication function, a function of storing and outputting information, etc., second main body parts 102a, 102b, and 102c may output information such as time, weather, financial information, news, etc. Another of the second main body parts 102a, 102b, and 102c may detect the environment in which the electronic device 300 is used, for example, temperature/humidity, illuminance, etc., and may be equipped with various types of sensor modules to measure a user's bio-information, etc. The other second main body parts 102a, 102b, and 102c may provide decorations, such as various lighting effects, etc. The first and second main body parts 101, 102a, 102b, and 102c may be arranged and mounted on a single cover member 104. The cover member 104 may include a cover coating 149a made of a flexible material and an inner housing 149c that is disposed on the inside of the cover coating 149a in order to mount the first and second main body parts 101, 102a, 102b, and 102c. The inner housing 149c may be bonded and fixed to the cover coating 149a through a bonding means, such as a thermal compression layer 149b, etc. The inner housing 149c may be a part of the first and second main body parts 101, 102a, 102b, and 102c.

The connecting part(s) 303a, 303b, and 303c include a part of the cover member 104, for example, a part of the cover coating 149a. For example, the outer coatings of the above-described embodiments may be implemented by a part of the cover coating 149a. The first and second main body parts 101, 102a, 102b, and 102c may be electrically connected to each other through an FPCB 151, and an inner cover member 131b may be attached opposite to an outer cover member 131a with respect to the FPCB 151, to conceal and protect the FPCB 151. Although not illustrated in FIG. 16, the reinforcing member or the shape memory member of the above-described embodiment may be disposed, as mentioned above, to conceal a difference in thickness of the wiring portion of the FPCB 151.

According to various embodiments of the present disclosure, the first and second main body parts 101, 102a, 102b, and 102c may be arranged on the outsides of the first cover members 141 and 143a or the second cover members 143, 143b, which are illustrated in FIG. 2 or 14. For example, the first or second cover member 141 or 143, which is illustrated in FIG. 2, may be implemented by the cover member 104 illustrated in FIG. 15. Accordingly, a user may execute various functions through the main body parts (e.g., the first and second main body parts 101, 102a, 102b, and 102c illustrated in FIG. 15) that are exposed to the outside even in a state in which the electronic device is folded.

Figure 17:
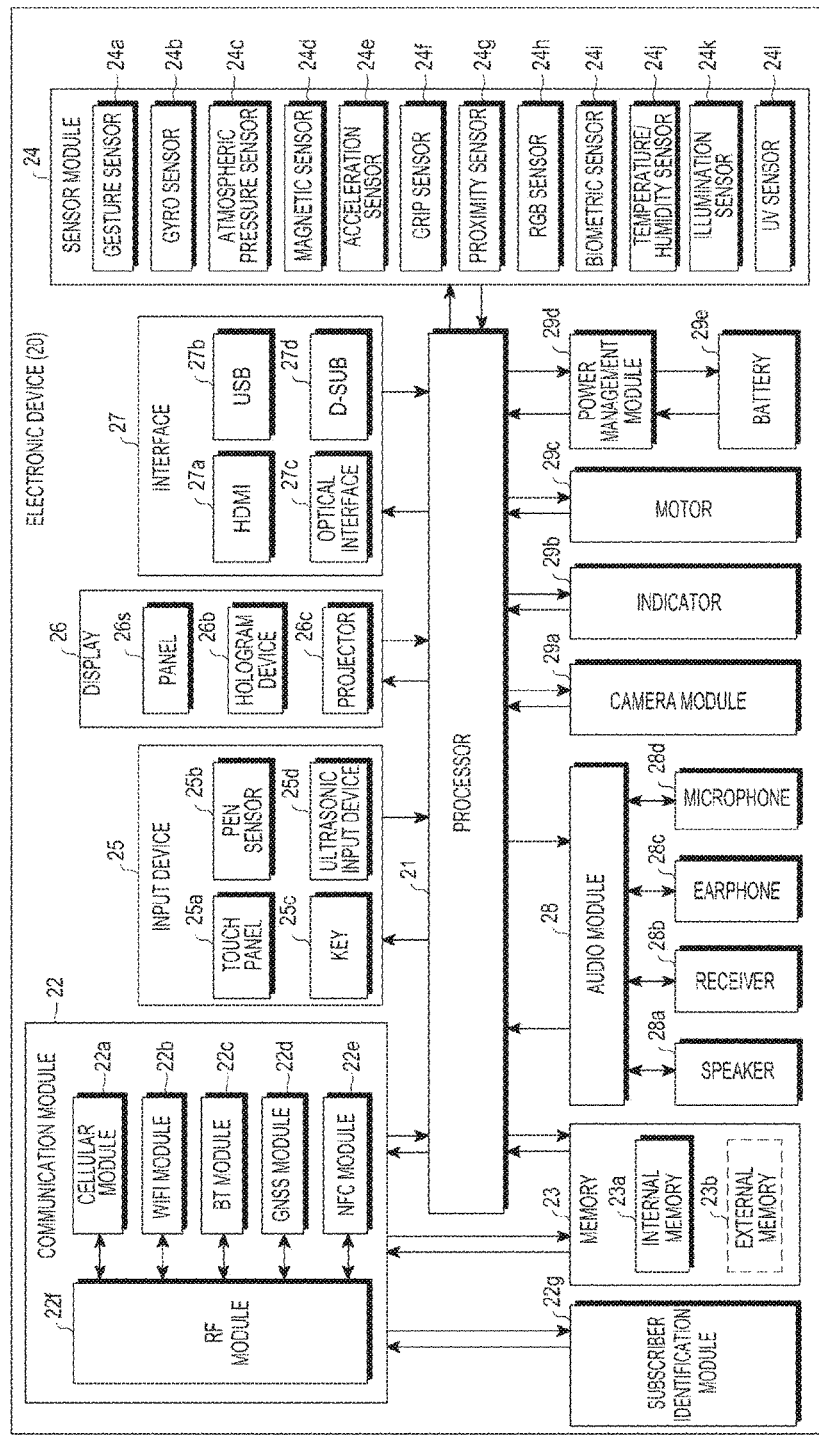
FIG. 17 is a block diagram illustrating the configuration of an electronic device according to various embodiments of the present disclosure.

FIG. 17 is a block diagram illustrating the configuration of an electronic device 20 according to various embodiments of the present disclosure.

Referring to FIG. 17, the electronic device 20 includes, for example, the entirety or a part of the above-described electronic devices 100, 200, and 300. The electronic device 20 includes at least one processor 21 (e.g., an Application Processor (AP)), a communication module 22, a subscriber identification module (SIM) 22G a memory 23, a sensor module 24, an input device 25, a display 26, an interface 27, an audio module 28, a camera module 29A, a power management module 29D, a battery 29E, an indicator 29B, and a motor 29C.

The processor 21 may control a plurality of hardware or software elements connected thereto and may perform various data processing and operations by driving an operating system or an application program. The processor 21 may be embodied as, for example, a system on chip (SoC). According to an embodiment of the present disclosure, the processor 21 may further include a Graphic Processing Unit (GPU) and/or an image signal processor. The processor 21 may include at least some (e.g., a cellular module 22A) of the elements illustrated in FIG. 17. The processor 21 may load, into a volatile memory, instructions or data received from at least one (e.g., a non-volatile memory) of the other elements, process the loaded instructions or data, and may store various data in a non-volatile memory.

The communication module 22 includes, for example, the cellular module 22A, a WiFi module 22B, a Bluetooth module 22C, a GNSS module 22D (e.g., a GPS module, a Glonass module, a Beidou module, or a Galileo module), an NFC module 22E, and a Radio Frequency (RF) module 22F.

The cellular module 22A may provide, for example, a voice call, a video call, a text message service, an Internet service, etc. through a communication network. According to an embodiment, the cellular module 22A may distinguish and authenticate the electronic device 20 within the communication network by using the subscriber identification module 22G (e.g., a SIM card). The cellular module 22A may perform at least some of the functions that the processor 21 may provide. The cellular module 22A may include a Communication Processor (CP).

The WiFi module 22B, the Bluetooth module 22C, the GNSS module 22D, or the NFC module 22E may include, for example, a processor for processing data that is transmitted and received through the corresponding module. At least some (e.g., two or more) of the cellular module 22A, the WiFi module 22B, the Bluetooth module 22C, the GNSS module 22D, and the NFC module 22E may be included in a single Integrated Chip (IC) or IC package.

The RF module 22F may transmit/receive, for example, a communication signal (e.g., an RF signal). The RF module 22F may include, for example, a transceiver, a Power Amp Module (PAM), a frequency filter, a Low Noise Amplifier (LNA), an antenna, etc. The cellular module 22A, the WiFi module 22B, the Bluetooth module 22C, the GNSS module 22D, and the NFC module 22E may transmit/receive an RF signal through a separate RF module.

The subscriber identification module 22G may include a card that includes an embedded SIM, and may contain unique identification information (e.g., an Integrated Circuit Card Identifier (ICCID)) or subscriber information (e.g., an International Mobile Subscriber Identity (IMSI)).

The memory 23 includes, for example, an internal memory 23A or an external memory 23B. The internal memory 23A may include at least one of, for example, a volatile memory (e.g., a Dynamic Random Access Memory (DRAM), a Static RAM (SRAM), a Synchronous Dynamic RAM (SDRAM), etc.) and a non-volatile memory (e.g., a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a flash memory (e.g., a NAND flash memory or a NOR flash memory), a hard disc drive, a Solid State Drive (SSD), etc.).

The external memory 23B may further include a flash drive, for example, a Compact Flash (CF), a Secure Digital (SD), a Micro Secure Digital (Micro-SD), a Mini Secure Digital (Mini-SD), an eXtreme Digital (xD), a Multi-Media Card (MMC), a memory stick, etc. The external memory 23B may be functionally and/or physically connected to the electronic device 20 through various interfaces.

The sensor module 24 may, for example, measure a physical quantity or detect the operating state of the electronic device 20 and may convert the measured or detected information into an electrical signal. The sensor module 24 includes at least one of, for example, a gesture sensor 24A, a gyro sensor 24B, an atmospheric pressure sensor 24C, a magnetic sensor 24D, an acceleration sensor 24E, a grip sensor 24F, a proximity sensor 24G, a color sensor 24H (e.g., a Red/Green/Blue (RGB) sensor), a biometric sensor 24I, a temperature/humidity sensor 24J, an illumination sensor 24K, and an Ultra Violet (UV) sensor 240L. Additionally or alternatively, the sensor module 24 may include, for example, an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 24 may further include a control circuit for controlling one or more sensors included therein. The electronic device 20 may further include a processor configured to control the sensor module 24 as a part of, or separately from, the processor 21, and may control the sensor module 24 while the processor 21 is in a sleep state.

The input device 25 includes, for example, a touch panel 25A, a (digital) pen sensor 25B, a key 25C, or an ultrasonic input device 25D. The touch panel 25A may use at least one of, for example, a capacitive type, a resistive type, an infrared type, and an ultrasonic type. Further, the touch panel 25A may include a control circuit. The touch panel 25A may further include a tactile layer and may provide a tactile reaction to a user.

The (digital) pen sensor 25B may include, for example, a recognition sheet which is a part of the touch panel or is separate from the touch panel. The key 25C may include, for example, a physical button, an optical key, or a keypad. The ultrasonic input device 25D may detect ultrasonic waves generated by an input tool through a microphone 28D and may identify data corresponding to the detected ultrasonic waves.

The display 26 includes a panel 26A, a hologram device 26B, or a projector 26C. The panel 26A may be, for example, flexible, transparent, or wearable. The panel 26A, together with the touch panel 25A, may be configured as a single module. The hologram device 26B may show a three dimensional image in the air by using interference of light. The projector 26C may display an image by projecting light onto a screen. The screen may be located, for example, in the interior of, or on the exterior of, the electronic device 20. The display 26 may further include a control circuit for controlling the panel 26A, the hologram device 26B, or the projector 26C.

The interface 27 includes, for example, a High-Definition Multimedia Interface (HDMI) 27A, a Universal Serial Bus (USB) 27B, an optical interface 27C, or a D-subminiature (D-sub) 27D. Additionally or alternatively, the interface 27 may include, for example, a Mobile High-definition Link (MHL) interface, a Secure Digital (SD) card/Multi-Media Card (MMC) interface, or an Infrared Data Association (IrDA) standard interface.

The audio module 28 may, for example, convert a sound into an electrical signal, and vice versa. The audio module 28 may process sound information that is input or output through, for example, a speaker 28A, a receiver 28B, earphones 28C, the microphone 28D, etc.

The camera module 29A is a device that may photograph a still image and a dynamic image. The camera module 29A may include one or more image sensors (e.g., a front sensor or a rear sensor), a lens, an Image Signal Processor (ISP), or a flash (e.g., an LED, a xenon lamp, etc.).

The power management module 29D may manage, for example, the power of the electronic device 20. According to an embodiment of the present disclosure, the power management module 29D may include a Power Management Integrated Circuit (PMIC), a charger Integrated Circuit (IC), or a battery gauge. The PMIC may use a wired and/or wireless charging method. Examples of the wireless charging method may include, for example, a magnetic resonance method, a magnetic induction method, an electromagnetic wave method, etc. Additional circuits (e.g., a coil loop, a resonance circuit, a rectifier, etc.) for wireless charging may be further included. The battery gauge may measure, for example, the residual quantity of the battery 29E, and a voltage, a current, or a temperature while charging. The battery 29E may include, for example, a rechargeable battery and/or a solar battery.

The indicator 29B may indicate a particular state (e.g., a booting state, a message state, a charging state, etc.) of the electronic device 20 or a part thereof (e.g., the processor 21). The motor 29C may convert an electrical signal into mechanical vibration and may generate a vibration, a haptic effect, etc. The electronic device 20 may include a processing unit (e.g., a GPU) for supporting mobile TV. The processing unit for supporting mobile TV may process media data according to a standard, for example, digital multimedia broadcasting (DMB), digital video broadcasting (DVB), MediaFlo™, etc.

Each of the above-described component elements of hardware according to the present disclosure may be configured with one or more components, and the names of the corresponding component elements may vary based on the type of electronic device. The electronic device according to various embodiments of the present disclosure may include at least aforementioned elements. Some elements may be omitted or other additional elements may be further included in the electronic device. Also, some of the hardware may be combined into one entity, which may perform functions identical to those of the relevant components before the combination.

The term "module" as used herein may, for example, refer to a unit including one of hardware, software, and firmware or a combination of two or more of them. The term "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Array (FPGA), and a programmable-logic device for performing operations which have been known or are to be developed hereinafter.

According to various embodiments of the present disclosure, at least some of the devices (for example, modules or functions thereof) or the method (for example, operations) may be implemented by a command stored in a computer-readable storage medium in a programming module form. When the command is executed by one or more processors, the one or more processors may perform a function corresponding to the command. The computer-readable storage medium may be, for example, the memory 23.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high level language codes, which may be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Further, some operations may be executed according to another order or may be omitted, or other operations may be added. Various embodiments of the present disclosure disclosed herein are provided merely to describe technical details of the present disclosure and to help the understanding of the present disclosure, and do not limit the scope of the present disclosure. Accordingly, the scope of the present disclosure should be construed as including all modifications or various other embodiments based on the technical idea of the present disclosure.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a first main body part;
   at least one second main body part connected to the first main body part so as to be rotatable, or such that the first and second main body parts pivot relative to each other; and
   a connecting part that connects the second main body part to the first main body part or another second main body part adjacent thereto,
   wherein the connecting part comprises:
      a connecting member that rotatably connects the first main body part and at least one second main body part and that includes an inner cover member and an outer cover member formed of a flexible material and bonded to face each other;
      a flexible printed circuit board (FPCB) that is interposed between the inner cover member and outer cover members and electrically connects the at least one second main body part to the first main body part; and
      a reinforcing member that is interposed between the inner cover member and the FPCB or between the outer cover member and the FPCB and at least partially overlaps the FPCB, wherein the electronic device further comprises:
   at least one bonding layer formed between the reinforcing member and the outer cover member or between the reinforcing member and the inner cover member; and
   a slot formed in the bonding layer, and
   wherein the FPCB is disposed in the slot while an edge of the FPCB is spaced apart from the bonding layer.

2. The electronic device of claim 1, wherein the second main body part is configured to rotate about the connecting part so as to be folded to face the first main body part.

3. The electronic device of claim 1, wherein the connecting part further comprises a shape memory member that faces the connecting member, and wherein the shape memory member is configured to rotatably connect the second main body part to the first main body part and to maintain the second main body part at a predetermined angle relative to the first main body part when the first and second main body parts are unfolded away from each other.

4. The electronic device of claim 3, wherein the connecting part further comprises a thermal compression layer interposed between the shape memory member and the connecting member, and wherein the shape memory member is bonded to the connecting member by the thermal compression layer.

5. The electronic device of claim 4, wherein the thermal compression layer is provided on opposite sides of the shape memory member.

6. The electronic device of claim 1,
wherein the reinforcing member is provided between the FPCB and the inner cover member while being bonded to the inner cover member and is configured to be partially bonded to the outer cover member by the bonding layer to slide relative to the outer cover member.

7. The electronic device of claim 1,
wherein the reinforcing member is provided between the FPCB and the outer cover member while being bonded to the outer cover member and is configured to be partially bonded to the inner cover member by the bonding layer to slide relative to the inner cover member.

8. The electronic device of claim 1, further comprising:
a shape memory member disposed between the FPCB and the outer cover member and/or between the FPCB and the inner cover member;
a thermal compression layer formed on one surface of the shape memory member that faces the FPCB; and
a slot formed in the thermal compression layer,
wherein the FPCB is disposed in the slot while the edge of the FPCB is spaced apart from the thermal compression layer.

9. The electronic device of claim 8, wherein one of the at least one
bonding layer is formed on another surface of the shape memory member that is opposite to the FPCB, and
wherein the bonding layer formed on the another surface of the shape memory member enables the shape memory member to slide relative to the inner or outer cover member that is bonded to face the other surface of the shape memory member.

10. The electronic device of claim 1, wherein the reinforcing member comprises a shape memory member that is disposed between the FPCB and the outer cover member and/or between the FPCB and the inner cover member.

11. The electronic device of claim 10, wherein the shape memory member is configured to rotatably connect the second main body part to the first main body part and to maintain the second main body part at a predetermined angle relative to the first main body part when the first and second main body parts are unfolded away from each other.

12. The electronic device of claim 10, wherein the shape memory member is disposed between the FPCB and the outer cover member and between the FPCB and the inner cover member, and wherein the connecting part further comprises a thermal compression layer that bonds the shape memory members facing each other, and a slot formed in the thermal compression layer.

13. The electronic device of claim 12, wherein the FPCB is disposed in the slot while the edge of the FPCB is spaced apart from the thermal compression layer.

14. The electronic device of claim 12, wherein the connecting part further comprises a bonding layer formed between the shape memory member and the outer cover member and a bonding layer formed between the shape memory member and the inner cover member, and wherein the shape memory member is bonded to the outer and inner cover members by the bonding layers to slide while facing the outer and inner cover members.

15. An electronic device comprising:
a first main body part;
at least one second main body part connected to the first main body part so as to be rotatable, or such that the first and second main body parts pivot relative to each other; and
a connecting part that connects the second main body part to the first main body part or another second main body part adjacent thereto,
wherein the connecting part comprises:
   a connecting member that rotatably connects the first main body part and at least one second main body part;
   a flexible printed circuit board (FPCB) that is surrounded by the connecting member and electrically connects the at least one second main body part to the first main body part:,
   a reinforcing member that is interposed between the connecting member and the FPCB and at least partially overlaps the FPCB,
   a shape memory member that faces the connecting member, the shape memory member being configured to rotatably connect the second main body part to the first main body part and to maintain the second main body part at a predetermined angle relative to the first main body part when the first and second main body parts are unfolded away from each other;
   a thermal compression layer interposed between the shape memory member and the connecting member, and wherein the shape memory member is bonded to the connecting member by the thermal compression layer; and
   a first slot formed in the thermal compression layer,
wherein the FPCB is disposed in the first slot while being spaced apart from the thermal compression layer between the shape memory member and the connecting member.

16. An electronic device comprising:
a first main body part;
at least one second main body part connected to the first main body part so as to be rotatable, or such that the first and second main body parts pivot relative to each other; and a connecting part that connects the second main body part to the first main body part or another second main body part adjacent thereto, the connecting part further comprising:
  a connecting member that rotatably connects the first main body part and at least one second main body part;
  a flexible printed circuit board (FPCB) that is surrounded by the connecting member and electrically connects the at least one second main body part to the first main body part; and
  a reinforcing member that is interposed between the connecting member and the FPCB and at least partially overlaps the FPCB;
a shape memory member that faces the connecting member, the shape memory member being configured to rotatably connect the second main body part to the first main body part and to maintain the second main body part at a predetermined angle relative to the first main body part when the first and second main body parts are unfolded away from each other; and
a first bonding layer interposed between the connecting member and the shape memory member, and wherein the first bonding layer is configured to bond the shape memory member to the connecting member to enable the shape memory member to slide relative to the connecting member.

17. An electronic device comprising:
a first main body part;
at least one second main body part connected to the first main body part so as to be rotatable, or such that the first and second main body parts pivot relative to each other; and
a connecting part that connects the second main body part to the first main body part or another second main body part adjacent thereto, the connecting part further comprising:
  a connecting member that rotatably connects the first main body part and at least one second main body part;
  a flexible printed circuit board (FPCB) that is surrounded by the connecting member and electrically connects the at least one second main body part to the first main body part; and
  a reinforcing member that is interposed between the connecting member and the FPCB and at least partially overlaps the FPCB;
a shape memory member that faces the connecting member, the shape memory member being configured to rotatably connect the second main body part to the first main body part and to maintain the second main body part at a predetermined angle relative to the first main body part when the first and second main body parts are unfolded away from each other; and
a second bonding layer that is formed along an edge of the reinforcing member,
wherein at least a part of the second bonding layer is configured to bond the reinforcing member to the shape memory member to enable the reinforcing member to slide relative to the shape memory member.

18. The electronic device of claim 17, wherein a part of the second bonding layer faces the connecting member, and the remaining part of the second bonding layer faces the connecting member with the edge portion of the reinforcing member in between.

19. The electronic device of claim 17, wherein the connecting part further comprises a second slot formed in the second bonding layer, and wherein the edge of the FPCB is configured to be spaced apart from the second bonding layer.

* * * * *